United States Patent
Sugawara et al.

(10) Patent No.: US 10,872,743 B2
(45) Date of Patent: Dec. 22, 2020

(54) SAMPLE HOLDING MECHANISM, MANUFACTURING METHOD FOR SAME, AND CHARGED PARTICLE BEAM DEVICE

(71) Applicant: HITACHI, LTD., Tokyo (JP)

(72) Inventors: Akira Sugawara, Tokyo (JP); Yoshio Takahashi, Tokyo (JP); Tetsuya Akashi, Tokyo (JP); Toshiaki Tanigaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 204 days.

(21) Appl. No.: 16/029,751

(22) Filed: Jul. 9, 2018

(65) Prior Publication Data

US 2019/0027338 A1 Jan. 24, 2019

(30) Foreign Application Priority Data

Jul. 19, 2017 (JP) .................. 2017-139589

(51) Int. Cl.
| | |
|---|---|
| *H01J 37/20* | (2006.01) |
| *H01J 37/244* | (2006.01) |
| *H01J 37/22* | (2006.01) |
| *G03H 5/00* | (2006.01) |
| *H01J 37/04* | (2006.01) |

(52) U.S. Cl.
CPC .............. *H01J 37/20* (2013.01); *G03H 5/00* (2013.01); *H01J 37/045* (2013.01); *H01J 37/22* (2013.01);
(Continued)

(58) Field of Classification Search
CPC .......... H01J 37/20; H01J 37/22; H01J 37/244; H01J 37/045; H01J 37/295; H01J 2237/20;
(Continued)

(56) References Cited

U.S. PATENT DOCUMENTS

| | | | | |
|---|---|---|---|---|
| 5,470,757 A | * | 11/1995 | Gagnon | .................. B01L 3/508 356/244 |
| 8,946,628 B2 | * | 2/2015 | Harada | .................. H01J 37/147 250/307 |

(Continued)

FOREIGN PATENT DOCUMENTS

| | | |
|---|---|---|
| JP | 2005-197165 A | 7/2005 |
| JP | 2011-026194 A | 2/2011 |

(Continued)

OTHER PUBLICATIONS

C.J. Russo and L.A Passmore, "Ultrastable gold substrates for electron cryomicroscopy," Science sciencemag.org, Dec. 12, 2014, vol. 346, Issue 6215, p. 1377-1380.

(Continued)

*Primary Examiner* — David E Smith
*Assistant Examiner* — Hsien C Tsai
(74) *Attorney, Agent, or Firm* — Volpe Koenig

(57) ABSTRACT

Continuous and automatic acquisition of electron beam holograms is made possible by using a sample holding mechanism that includes a sample end region that has a linear shape that is suited for electron beam holography, separates a thin-film rectangular window with an extreme-thin support film that supports a sample being disposed and a rectangular hole that has a linear-shaped edge and through which a reference wave is transmitted from each other, and configures a part of a layer that is thicker than the support film.

12 Claims, 14 Drawing Sheets

(52) U.S. Cl.
CPC ........ *H01J 37/244* (2013.01); *G03H 2224/04* (2013.01); *H01J 2237/043* (2013.01); *H01J 2237/20* (2013.01)

(58) Field of Classification Search
CPC ............. H01J 2237/043; H01J 2237/26; H01J 2237/1514; H01J 2237/2614
See application file for complete search history.

(56) References Cited

U.S. PATENT DOCUMENTS

| | | |
|---|---|---|
| 2007/0272861 A1 | 11/2007 | Harada et al. |
| 2011/0020563 A1 | 1/2011 | Jiang et al. |
| 2013/0284925 A1 | 10/2013 | Tanigaki et al. |
| 2016/0157741 A1 | 6/2016 | Chen et al. |
| 2016/0329187 A1 | 11/2016 | Kidwell |

FOREIGN PATENT DOCUMENTS

| | | |
|---|---|---|
| JP | 2013-229190 A | 11/2013 |
| JP | 2016-110877 A | 6/2016 |

OTHER PUBLICATIONS

H.W. Lefevre, R.M.S. Schofield, and D.R. Ciarlo, "Thin Si3N4 windows for energy loss STIM in air," Nuclear Instruments and Methods in Physics Research, B54 (1991), pp. 47-51.

\* cited by examiner

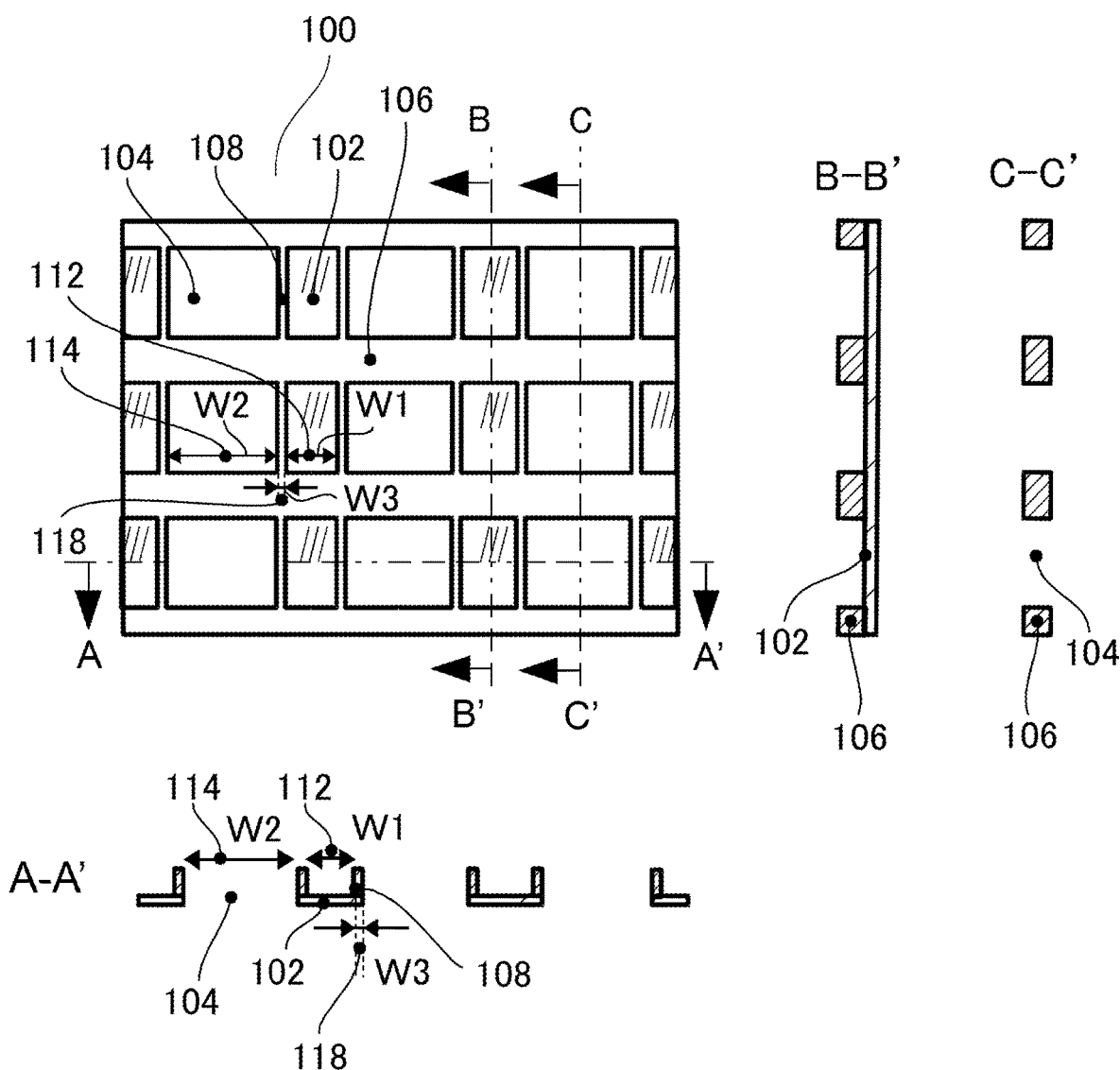

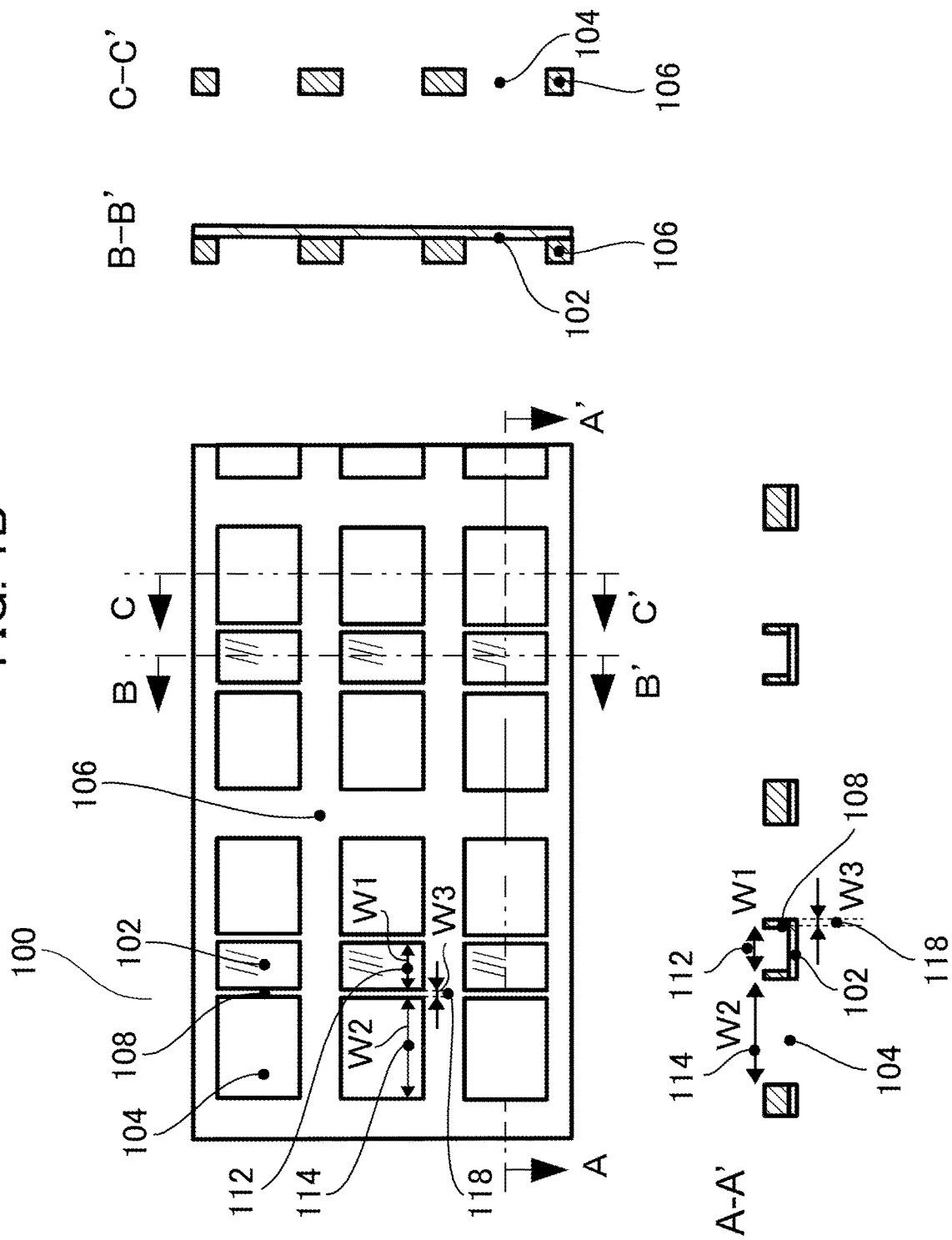

FIG. 3
(a) 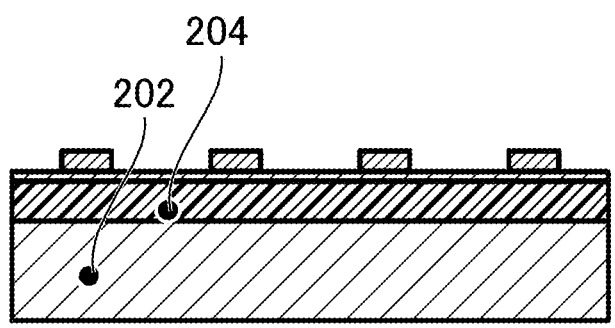
(b) 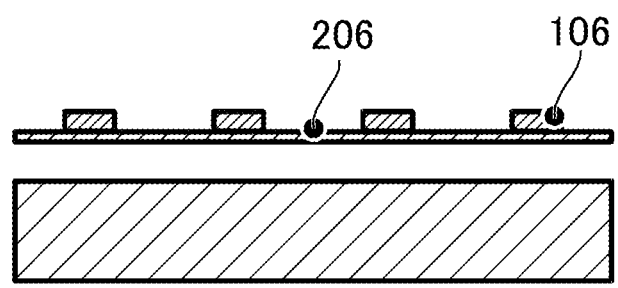
(c) 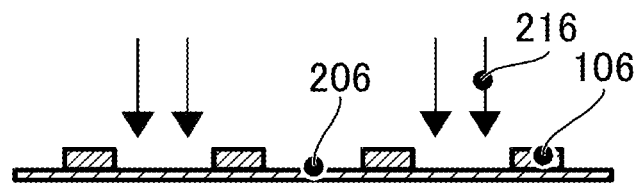
(d) 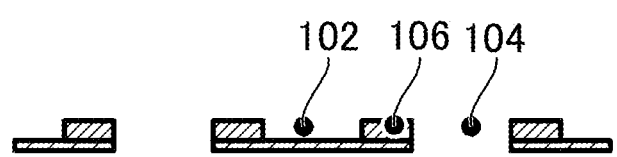

SAMPLE HOLDING MECHANISM, MANUFACTURING METHOD FOR SAME, AND CHARGED PARTICLE BEAM DEVICE

CLAIM OF PRIORITY

The present application claims priority from Japanese Patent application serial No. 2017-139589, filed on Jul. 19, 2017, the content of which is hereby incorporated by reference into this application.

BACKGROUND

The present invention pertains to a charged particle beam device and, in particular, relates to a sample holding and shifting technology that is favorable for electron beam holographic observation of a sample that is an observation object.

In observation of a sample self-supporting of which is difficult such as fine particles and so forth by a charged particle beam device such as an electron microscope and so forth, it is widely conducted to observe the sample by spraying it on a support film. Self-supporting of the support film itself is also difficult and therefore it is widely conducted to fix the support film to a net-like and mechanically strong grid. Electron beam holography is a measurement method that is derived from transmission electron microscopy and is a technology of measuring a phase of an electron beam by using an effect of interference between an object wave that passes through the sample and a reference wave that is transmitted through a vacuum.

The sample observation of which is possible through a transmission type electron microscope is limited to the sample of a thickness that allows transmission of an electron beam that is several ten kilovolts to 3000 kilovolts in accelerating voltage. In a case where an end of a thick sample is thinned to a thickness that allows transmission of the electron beam by mechanical grinding, electrolytic grinding, ion grinding and so forth, there are many cases where self-supporting of the sample becomes possible because the sample is linked with a mechanically strong part. On the other hand, in a case where a sample such as, for example, the fine particles and so forth is to be observed, it is impossible to suspend the sample in a vacuum and therefore the sample is observed in a state of being disposed on a support film through which the electron beam is transmitted. Such a sample holding method becomes a big issue from the early 1950s immediately after practical realization of electron microscopy and a method of forming an amorphous carbon film and a silicon oxide film by vacuum vapor deposition, a method of forming a polymer film and so forth that are used for fixing the fine particle sample are developed. In addition, since self-supporting of the above-described support films themselves is also impossible, a method of fixing the support film on a single-hole or net-like structure that has a hole of several microns to several hundred microns is also developed together with the above-described methods and a structure in which circular or square fine holes of several ten microns to several hundred microns in size that are produced by lithography and etching are arrayed in a metal plate and a polymer film that is called a micro grid in which micron-sized holes are formed are put into practical use. These methods are summarized in "Technology of Electron Microscope", Chapter 3, Asakura Publishing Co. Ltd., and C. J. Russo and L. A. Passmore, Science, 346 (2014) 1377. Further, in association with attainment of higher resolution of the electron microscope, upgrading of a technology for minimizing the influence of contrast that is generated from the support film itself on an electron microscopic image by suppressing vibration and drift motion of the sample and using an extremely thin support film is requested. A technique of supporting a single-layered graphene support film on a grid-structure that is configured by carbon nanotube bundles (see, for example, Japanese Unexamined Patent Application Publication No. 2011-026194), a method of fixing an extreme-thin carbon layer to a structure in which rectangular holes of about one micron in opening size are regularly formed in a metal thin film by a micromachining method (see, for example, C. J. Russo and L. A. Passmore, Science, 346 (2014) 1377) and so forth are developed. In particular, the later method plays an important part in a technique that is called single particle analysis in which structure analysis is performed by automatically acquiring and statistically analyzing images of many fine particles.

In general electron microscopic observation is, the intensity (the amplitude) of an electron wave is measured. On the other hand, electron beam holography is a measurement method performed in order to determine the phase of the electron wave. It is necessary to measure an intensity distribution by causing quantum interference to occur between an electron wave that passes through a substance and an electron wave that is not disturbed by a substance which passes through a vacuum region by using a mechanism that is called an electron beam biprism in order to determine a change in phase of the electron wave that occurs by passing through the substance (see, for example, Japanese Unexamined Patent Application Publication No. 2005-197165 and Japanese Unexamined Patent Application Publication No. 2013-229190). That is, in the general electron microscopic observation, it is permissible to spread the support film all over a surface. On the other hand, in electron beam holographic observation, it is necessary that a sample support film region and a hole region on which the support film is not present be located adjacent to each other. In measurement of a thick sample self-supporting of which is possible, interference is caused to occur between a wave-front of an electron wave which passes the outer side of the sample and a wave-front of an electron wave which passes through within the sample by bringing an end of the sample to the vicinity of the center of a beam-irradiated region. In addition to the above-described literatures, also see, for example, H. W. Lefevre, R. M. S. Schofield and E. R. Ciarlo, Nuclear Instruments and Methods in Physics Research, B54 (1991) 47 and Akira Fukami, "Electron Microscope", Vol. 2, (1951 to 1952) No. 2 p 126.

SUMMARY

In a case where the end of the above-described thin support film is disposed in the vicinity of the center of the beam-irradiated region, an edge of the thin support film that is a soft structure is turned up and irregularly swings by being irradiated with an electron beam, and thereby high-resolution observation becomes difficult. In a case where an observation object that induces large phase change of the electron beam when observed is present on an amorphous support film, there are cases where no practical issue occurs even when the electron wave that is transmitted through a support film part on which no object is present is used as the reference wave on the assumption that the wave-front of the electron wave that is transmitted through the amorphous support film region is not largely disturbed. On the other hand, in a case where the phase change of the electron beam is small, it is difficult to justify this assumption.

In addition, it is desirable that a boundary line between the support film region and the hole region be formed into a linear shape. It is possible to simplify a positional relation among the electron beam biprism, the sample, and a detector and decision of a control algorithm when continuously and automatically acquiring electron beam holograms is simplified by forming the boundary line into the linear shape, and thereby single particle analysis by electron beam holography is facilitated.

In a case where the fine particles and so forth are to be observed by the electron beam holography, it is necessary to fix the sample to the extreme-thin support film. However, when the extreme-thin support film is used alone, the region on which the sample is supported swings under the influence of turning-up of the thin film edge and the irradiated electron beam and a boundary part between the support film region and a vacuum region (corresponding to the hole region) through which the reference wave is transmitted is not formed into the linear shape. Accordingly, an issue to be solved by the invention of the present application lies in the fact that a sample supporting method that makes it possible to separate a part through which the reference wave passes (corresponding to the hole region) and a sample support part (corresponding to the support film region) from each other along a linear boundary that is suited for holographic measurement and to fix the sample so as not swing is not yet provided and, in addition, in association with no provision of the above-described sample supporting method, it is difficult to perform continuous and automatic acquisition of the electron beam holograms.

The present invention has been made in order to solve the abovementioned issue and aims to provide a sample holding mechanism that is able to separate the part through which the reference wave passes and the sample support part from each other along the linear boundary that is suited for holographic measurement and is able to fix the sample so as not to swing, a manufacturing method for the sample holding mechanism and a charged particle beam device that includes the sample holding mechanism.

In order to solve the above-described issue, according to one aspect of the present invention, there is provided a sample holding mechanism that includes a window (corresponding to the support film region) with a support film that supports a sample being disposed, a hole (corresponding to the hole region) that has a linear-shaped edge and through which a reference wave is transmitted, and a layer that is thicker than the support film that is disposed on an edge of the window.

In addition, in order to solve the above-described issue, according to another aspect of the present invention, there is provided a manufacturing method for a sample holding mechanism that includes a window with a support film that supports a sample being disposed, a hole that has a linear-shaped edge and through which a reference wave is transmitted, and a layer that is thicker than the support film that is disposed on an edge of the window, including the steps of sequentially forming a sacrificing layer, a support layer and a resist layer on a substrate, forming a pattern of the thick layer on the support layer using a first resist pattern, and forming a pattern of the holes in the support layer using a second resist pattern.

Further, in order to solve the above-described issue, according to further another aspect of the present invention, there is provided a charged particle beam device that includes an electron source, a sample holding mechanism that includes a window with a support film that supports a sample being disposed, a hole that has a linear-shaped edge and through which a reference wave is transmitted, and a layer that is thicker than the support film that is disposed on an edge of the window and in which the multiple windows and the multiple holes are arrayed, a mechanical movement mechanism that performs movement of the sample holding mechanism, an image shift deflection optical system that performs parallel shifting of an image along a linear-shaped side of the hole in the sample holding mechanism, a detector that detects an electron beam that is emitted from the electron source and is transmitted through the sample holding mechanism, and a control unit that performs visual field selection by controlling the image shift deflection optical system and the mechanical movement mechanism and controls to continuously acquire images from an array of the windows and the holes on the basis of an output from the detector.

According to the present invention, it is possible to provide the sample holding mechanism in which the thin support film part (corresponding to the window) adapted to support the film and the vacuum region part (corresponding to the hole) are separated from each other along the linear-shaped boundary part that is made thicker than the support film so as to be suited for electron beam holographic measurement and, in addition, automatic acquisition of mass data is made possible by using the sample holding mechanism.

BRIEF DESCRIPTION OF THE DRAWINGS

FIG. 1A is a diagram illustrating one configuration example of a sample holding mechanism according to a first embodiment;

FIG. 1B is a diagram illustrating another configuration example of the sample holding mechanism according to the first embodiment;

FIGS. 3(a)-(d) are diagrams illustrating another example of the procedure for manufacturing the sample holding mechanism according to the first embodiment;

DETAILED DESCRIPTION

Figure 2:
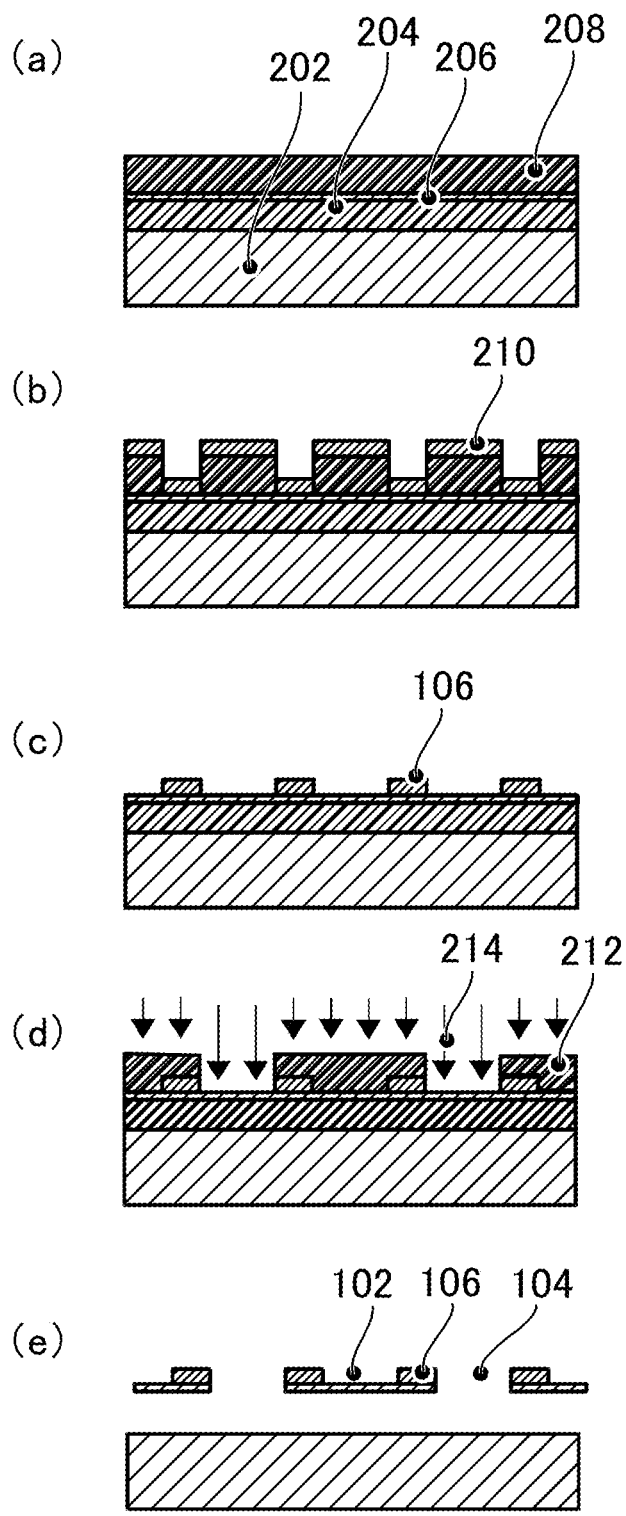
FIGS. 2(a)-(e) are diagrams illustrating one example of a procedure for manufacturing the sample holding mechanism according to the first embodiment.

In the following, embodiments of the present invention will be sequentially described in accordance with the drawings. In the respective embodiments that will be described in the following, although description will be made by exemplifying a rectangular window as a window with a support film that supports a sample being disposed and exemplifying a rectangular hole as a hole that has a linear-shaped edge and through which a reference wave is transmitted, the window and the hole may be optionally shaped not limited to the rectangular shape as long as the hole has the linear-shaped edge and is able to transmit the reference wave.

First Embodiment

The first embodiment is one embodiment of a sample holding mechanism that includes a window with the support film that supports a sample being disposed, a hole that has a linear-shaped edge and through which a reference wave is transmitted, and a layer that is thicker than the support film that is disposed on an edge of the window. In particular, the first embodiment is an embodiment of a sample holding mechanism that includes a rectangular window with the support film that supports the sample being disposed, a rectangular hole that has the linear-shaped edge and through which the reference wave is transmitted, and the layer that is thicker than the support film that is disposed around the rectangular window and the rectangular hole. In addition, the first embodiment is an embodiment of a sample holding mechanism configured that respective regions of the layer that is thicker than the support film that is disposed on the edge of each of the multiple rectangular windows are continuously linked together.

FIG. 1A illustrates one configuration example of a sample holding mechanism 100 according to the first embodiment configured that a thin-film rectangular window 102 with the support film that supports the sample being disposed and a rectangular hole 104 through which the reference wave is transmitted are separated from each other by a linear-shaped layer 106 that is thicker than the support film. The sample holding mechanism 100 according to the first embodiment includes the thin-film rectangular window 102 with the support film that supports the sample being disposed, the rectangular hole 104 through which the reference wave is transmitted, and the layer 106 that is thicker than the support film. Incidentally, in the thick film 106, a linear-shaped part that separates the thin-film rectangular window 102 and the rectangular hole 104 from each other is called a sample end region 108. It is desirable that an extreme thin film that is, for example, less than about 50 nanometers in thickness and is configured by substances such as amorphous carbon, graphite, graphene, boron nitride, beryllium oxide, silicon oxide, silicon nitride and so forth that each contain a light element as a principal component be stretched on the thin-film rectangular window 102 for the purpose of minimizing a noise that is applied to an image when an electron beam is transmitted through the window.

In the configuration of the first embodiment, the thick layer 106 is formed on all regions other than the thin-film rectangular window 102 that serves as an extreme-thin support layer and the rectangular hole 104 and improves the mechanical strength of the sample holding mechanism 100. A particularly important part is the linear-shaped sample end region 108 that is formed to surround the rectangular window 102 and this part avoids turning-up of the edge that would occur when the extreme-thin support layer exits alone.

A width 112 (W1) of the thin-film rectangular window 102, a width 114 (W2) of the rectangular hole 104, and a width 118 (W3) of the sample end region 108 may be optionally defined within a manufacturable range. However, it is desirable that the reference hologram be formed with ease using electrons that are transmitted through only the rectangular hole 104 through which the reference wave is transmitted for the purpose of performing highly accurate electron beam phase measurement. For this reason, it is desirable that the following Formula 1 be satisfied.

$$W2 > 2 \times W1 \tag{Formula 1}$$

In addition, the wider the width 118 (W3) of the sample end region is, the easier the mechanical strength is obtained. On the other hand, the wider the width 118 (W3) is, the more fringe contrast of the hologram that is obtained as a result of electron beam interference is lowered and the more phase detection sensitivity is lowered. Therefore, it is desirable that the width 118 (W3) of the sample end region 108 be not more than about 500 nanometers.

FIG. 1B illustrates another configuration example of the sample holding mechanism 100 according to the first embodiment that includes the window 102 with the support film that supports the sample being disposed, the hole 104 that has the linear-shaped edge and through which the reference wave is transmitted, and the layer 106 that is thicker than the support film that is disposed on the edge of the window. Also, in this configuration example, the sample holding mechanism 100 has a configuration in which the thin-film rectangular window 102 with the support film that supports the sample being disposed and the rectangular hole 104 through which the reference wave is transmitted are separated from each other by the linear-shaped layer 106 that is thicker than the support film. In addition, the layer 106 that is thicker than the support film that is disposed on the edge of each of the multiple thin-film rectangular windows 102 has a configuration that respective regions thereof are continuously linked together.

The configuration illustrated in FIG. 1B is different from the configuration illustrated in FIG. 1A in the point that the respective regions of the wide and thick layer 106 are periodically formed in a longitudinal direction in FIG. 1B. Although the function as the sample holding mechanism 100 is the same as that in FIG. 1A, it is possible to more increase the strength of the sample holding mechanism 100 owing to periodic formation of the regions of the wide and thick layer 106 in the longitudinal direction.

FIG. 2 illustrates one example of a manufacturing process for realizing the configuration of the above-described sample holding mechanism 100 in FIG. 1A. Here, a case where the sample holding mechanism 100 is manufactured by, for example, a micromachining method using lithography and broad beam ion etching will be described. That is, in a manufacturing method for the sample holding machine 100. The sample holding mechanism 100 includes the window 102 with the support film that supports the sample being disposed, the hole 104 that has the linear-shaped edge and through which the reference wave is transmitted, and the layer 106 that is thicker than the support film that is disposed on the edge of the window 102. The manufacturing method for sample holding mechanism includes the steps of sequentially forming a sacrificing layer, a support layer and a resist layer on a substrate, forming a pattern of the thick layer on the support layer using a first resist pattern formed by development processing, and thereafter forming a pattern of holes in the support layer using a second resist pattern formed by the development processing.

Incidentally, it is also possible to manufacture the sample holding mechanism 100 in FIG. 1B by a manufacturing process that is similar to that for the sample holding mechanism 100 in FIG. 1A. First, as illustrated in (a) of FIG. 2, a sacrificing layer 204 is coated onto a substrate 202 on which a flat surface is obtained over a large area by, for example, spin-coating and so forth, then an extreme-thin support layer 206 that will serve as the thin-film rectangular window 102 is formed on the sacrificing layer 204 by, for example, vacuum vapor deposition, sputtering, ion beam sputtering, a CVD method and so forth, a negative-type resist layer 208 is formed on the extreme-thin support layer 206 and thereby a three-layered structure that is configured by the sacrificing layer 204, the extreme-thin support layer 206 and the negative type resist layer 208 is formed on the substrate 202. The extreme-thin support layer 206 will serve as the thin-film rectangular window 102 and therefore is preferably made of, for example, amorphous carbon, graphite, graphene, boron nitride, beryllium oxide, silicon oxide, silicon nitride and so forth that each contain the light element as the principal component, and the thickness of the extreme-thin support layer 206 is defined to be not more than about 500 nanometers.

Then, as illustrated in (b) of FIG. 2, exposing and developing processes are performed so as to form the first resist pattern and then to grow a reinforcement layer 210 which will serve as the thick layer 106 on the first resist pattern. The substance of the reinforcement layer 210 may be the same as the substance of the extreme-thin support layer 206 and/or may be a metal that is rich in malleability and/or a semiconductor selective etching of which is possible. Then, as illustrated in (c) of FIG. 2, lift-off processing is performed and thereby the thick layer 106 that is obtained by patterning the reinforcement layer 210 remains on the extreme-thin support layer 206.

Then, as illustrated in (d) of FIG. 2, the negative-type resist layer 208 is again coated on the thick layer 106. Thereafter, a second resist pattern 212 is formed by performing drawing and developing processes on the negative-type resist layer and thereafter the rectangular hole 104 is formed in the extreme-thin support layer 206 by performing broad beam ion etching processing 214 using argon gas and so forth.

Finally, as illustrated in (e) of FIG. 2, the sacrificing layer 204 is removed with acids, alkalis, organic solvents and so forth and thereby it is possible to separate a grid that is configured by the thin-film rectangular window 102, the rectangular hole 104 through which the reference wave is transmitted, and the layer 106 that is thicker than the above-described support film from the substrate 202. The separated sample holding mechanism 100 (the grid) may be used in a state of being captured on a commercially available electron microscopy sample grid handling of which is possible with tweezers.

FIG. 3 illustrates another example of the manufacturing process to be performed in order to realize the configuration of the sample holding mechanism 100 according to the first embodiment. Here, a procedure of manufacturing the sample holding mechanism 100 by, for example, a micromachining method using lithography and focused ion beam etching is illustrated. The configuration in (a) of FIG. 3 is the same as that illustrated in (c) of FIG. 2. Then, as illustrated in (b) of FIG. 3, a workpiece in which the thick layer 106 that is patterned is formed on the continuous extreme-thin support layer 206 is separated from the substrate 202 by removing the sacrificing layer 206 with acids, alkalis, organic solvents and so forth. Then, as illustrated in (c) of FIG. 3, the rectangular hole 104 through which the reference wave is transmitted is formed by performing selective ion beam etching by focused ion beam machining 216 and thereby it is possible to form the grid that is configured by the thin film rectangular window 102, the rectangular hole 104 through which the reference wave is transmitted, and the layer 106 that is thicker than the above-described support film as illustrated in (d) of FIG. 3.

Figure 4:
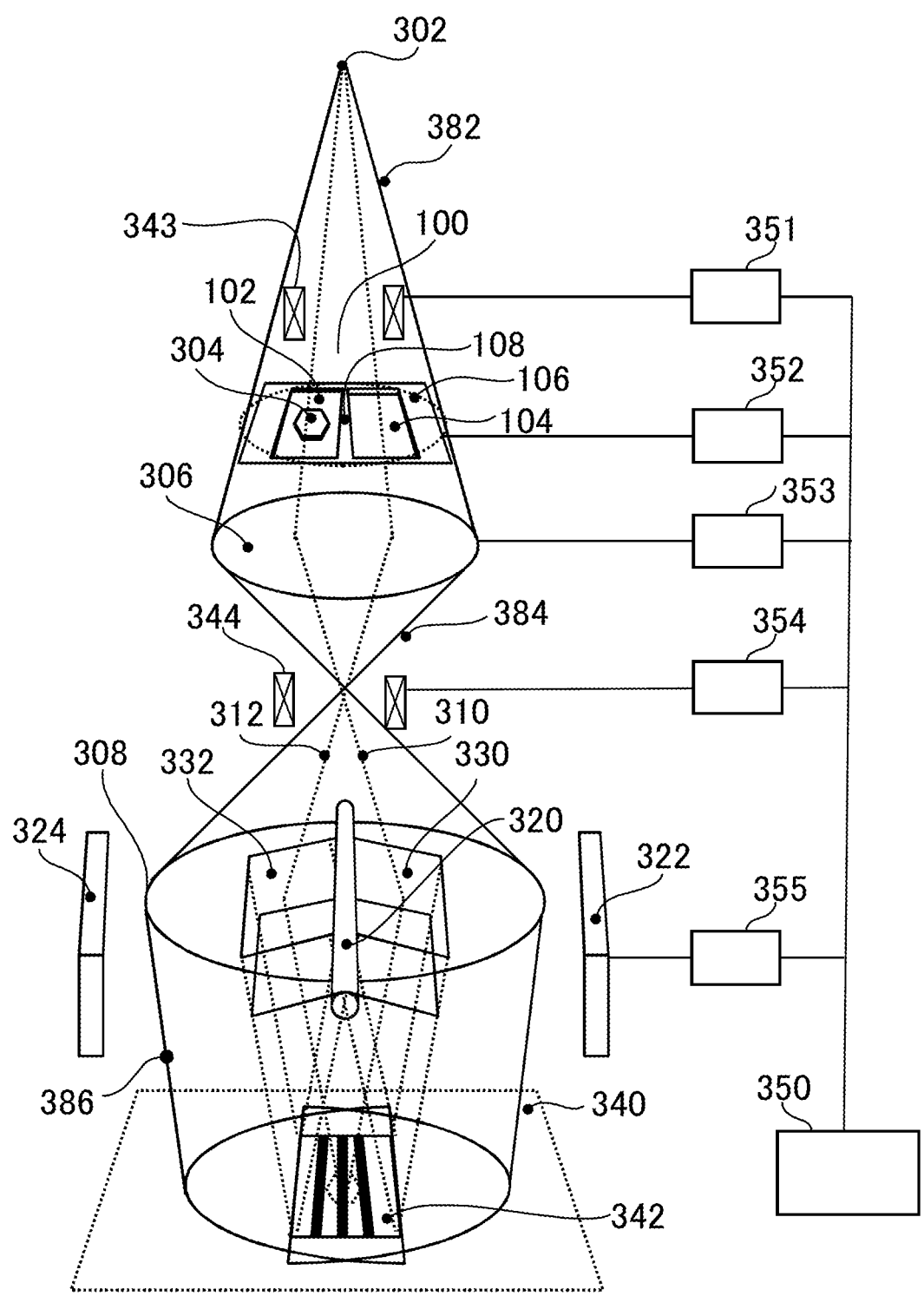
FIG. 4 is a diagram illustrating one example of arrangement for electron beam holographic measurement to be performed by using the sample holding mechanism according to the first embodiment.

FIG. 4 illustrates one example of a basic configuration of a charged particle beam device that performs electron beam holographic measurement by using the sample holding mechanism 100 according to the first embodiment. An electron wave (beam) that is generated from an electron source 302 propagates having a certain solid angle, passes through the sample holding mechanism 100, an objective lens 306, and an electron beam biprism 308 and reaches a detector surface 340 of a detector that detects the electron beam. Regions through which the electron beam passes in a time period after generated from the electron source 302 until reaching the detector surface 340 is illustrated by conical surfaces 382 and 384, and a truncated cone surface 386. The sample holding mechanism 100 is disposed in the conical region (surface) 382 that is located between the electron source 302 and the objective lens 306 and through which the electron beam passes. The sample holding mechanism 100, the objective lens 306, and the electron beam biprism 308 are controlled by a sample holding mechanism control unit 352, an objective lens control unit 353, and an electron beam biprism control unit 355 respectively. Incidentally, it is possible for the sample holding mechanism control unit 352 to control a rotation mechanism that is disposed in a sample holder that will be described later and to which the sample holding mechanism 100 is to be attached and it is possible for the electron beam biprism control unit 355 to control rotation of an electron beam biprism wire.

In addition, as illustrated in FIG. 4, the charged particle beam device further includes a beam blanking system 343 that is disposed between the electron source 302 and the sample holding mechanism 100, is configured by a beam shutter coil and turns on/off the electron beam. An image shift deflection optical system 344 that is configured by an image shift coil is disposed between the objective lens 306 and the electron beam biprism 308. The beam blanking system 343 and the image shift deflection optical system 344 are controlled by a beam blanking system control unit 351 and an image shift deflection optical system control unit 354 respectively. The respective control units 351 to 355 are controlled by a system control computer 350 that functions as a control unit that controls the whole charged particle beam device. The system control computer 350 that functions as the control unit has a general computer configuration, may be realized by a personal computer that includes a central processing unit (CPU) that executes various control programs, a memory unit, input/output units such as a display, a keyboard and so forth, an interface unit and so forth, and is able to perform hologram screen display that will be described later on the display.

As illustrated in FIG. 1A and FIG. 1B, the sample holding mechanism 100 includes the thin-film rectangular window 102 with the support film that supports the sample being disposed, the rectangular hole 104 through which the reference wave is transmitted, and the layer 106 that is thicker than the above-described support film. In the thick layer 106, the linear-shaped sample end region 108 separates the thin-film rectangular window 102 and the rectangular hole 104 through which the reference wave is transmitted from each other. In the examples illustrated in FIG. 1A and FIG. 1B, an observation sample 304 is placed on the thin-film rectangular window 102. The phase of the electron wave that is transmitted through the thin-film rectangular window 102 and the observation sample 304 is changed depending on internal potentials of the substances that configure the thin-film rectangular window 102 and the observation sample 304 or an electromagnetic field. That is, after passing through the sample 304, the wave-front of the electron wave distorts. This distorted wave is called an object wave. On the other hand, no phase change occurs in the electron beam that is transmitted through the rectangular hole 104. This wave is called a reference wave. When these electron waves pass through the objective lens 306, the electron waves once focus on one point as illustrated by the conical surface 384 and then diverge again. A typical route of the object wave is illustrated by a dotted-line 310 and a typical route of the reference wave is illustrated by a dotted-line 312.

Then, the electron waves pass through the electron beam biprism 308. The electron beam biprism 308 includes an electron beam biprism wire 320 that is formed by using an electroconductive thin line that is not more than about 1 micron in width and to which a positive potential is applied and a set of grounded facing electrodes 322 and 324. Since an electric field is generated between the electron beam biprism wire 320 and each of the facing electrodes 322 and 324, the electron waves that pass through regions where the electric fields are generated are deflected with Coulomb's force in opposite directions on the right side and the left side of the electron beam biprism wire 320. That is, the wave-front of the electron beam is divided into two regions having different inclinations. An object wave wave-front 330 of the inclined object wave and a reference wave wave-front 332 of the reference wave mutually overlap with progress and form electron beam interference fringes 342 on the detector surface 340. It is possible to determine the phase of the electron beam by performing Fourier analysis on the interference fringes. Incidentally, in disposition of the electron beam biprism 308, the multiple electron beam biprisms may be disposed downstream of the objective lens (see, for example, Japanese Unexamined Patent Application Publication No. 2005-197165) and/or one electron beam biprism may be disposed upstream of the sample and the multiple electron beam biprisms may be disposed downstream of the sample (see, for example, Japanese Unexamined Patent Application Publication No. 2013-229190).

Here, the object wave wave-front 330 and the reference wave wave-front 332 would be separated from each other by a straight line as long as the linear-shaped electron beam biprism wire 320 is used. When thinking about the shape of the sample by going back to the upstream, in a case where the end shape of the sample is not straight and is out of shape, it is difficult to uniquely determine the positional relation between the electron beam biprism wire 320 and the sample holding mechanism 100 and therefore it is difficult to efficiently cause the interference to occur between the electron beams.

The particularly important point of the first embodiment is that an external form that is well defined is given to the sample holding mechanism 100 by, for example, the micro-machining method and so forth and thereby it becomes possible to separate the region (the rectangular window) 102 through which the object wave passes and the region (the rectangular hole) 104 through which the reference wave passes from each other by the linear-shaped sample end region 108 and to uniquely determine the positional relation between the electron beam biprism wire 320 and the sample end region 108 so as to be located in parallel with each other. It is desirable to control an angular relation between the electron beam biprism wire 320 and the sample end region 108 for effective functioning of the phase measurement. A method of setting the sample holding mechanism 100 with no occurrence of angular difference when attaching the sample holding mechanism 100 to a sample holder, a method of providing a rotation mechanism in the sample holder to which the sample holding mechanism 100 is to be attached, a method of providing a mechanism that rotates the electron beam biprism wire 320 and so forth are adopted, the system control computer 350 that is the control unit controls the sample holding mechanism control unit 352 and the electron beam biprism control unit 355, and thereby it becomes possible to control the angular relation between the electron beam biprism wire 320 and the sample end region 108.

In addition, it becomes important to deduct the influence of electron beam phase distortion and image distortion that the electron beam biprism wire 320 itself produces in highly accurate phase measurement. For this purpose, the wave-front of the electron wave that is transmitted through only the rectangular hole 104 through which the reference wave is transmitted is divided into the two wave-fronts by the electron beam biprism wire 320, the electron beam interference fringes 342 between the electron waves that propagate in a vacuum are formed on the detector surface 340 and thereby a reference hologram is acquired. It is desirable that the width of the rectangular hole 104 be sufficiently wide and be at least two times the width of the rectangular window 102 in order to facilitate acquisition of the reference hologram. As described above, this serves as an evidence of Formula 1 that indicates a desirable relation between the width W1 of the rectangular window 102 with the support film that supports the sample being disposed and the width W2 of the rectangular hole 104.

Second Embodiment

Figure 5:
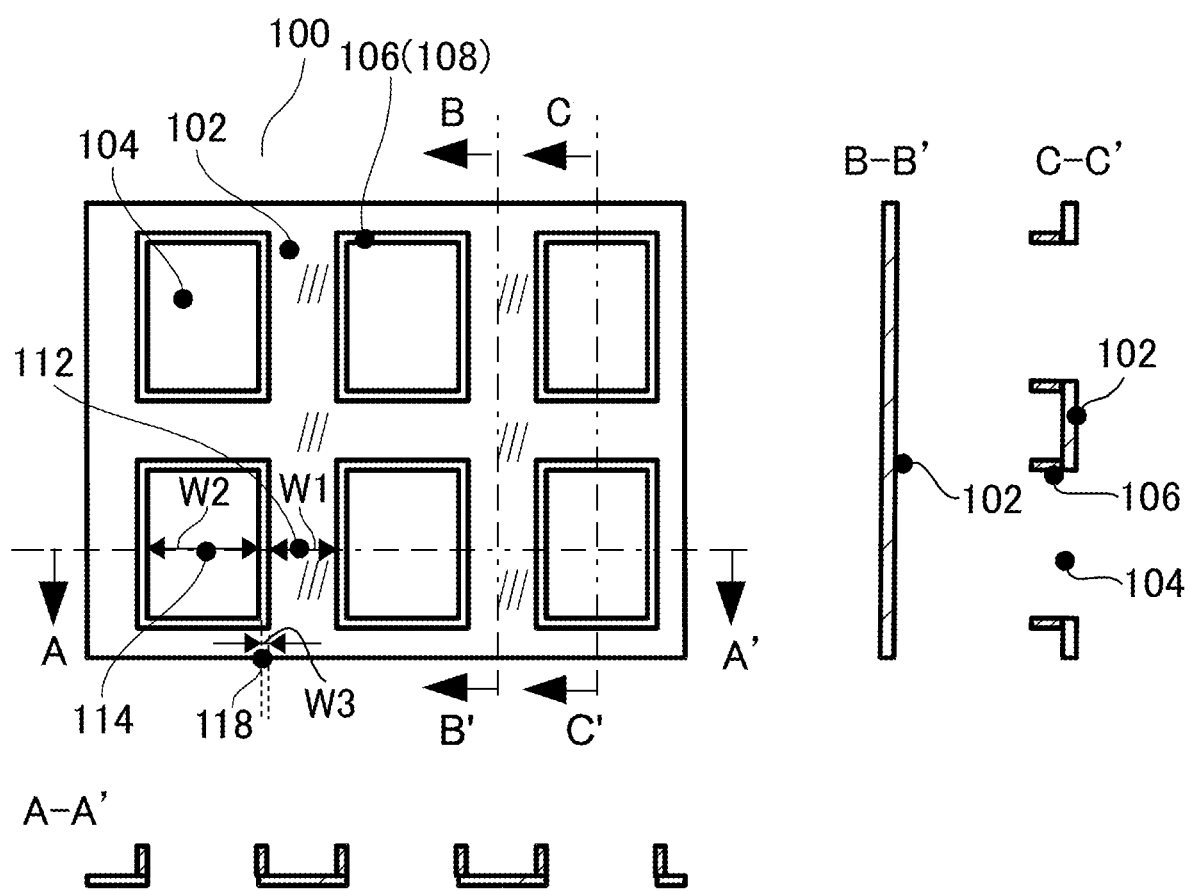
FIG. 5 is a diagram illustrating one configuration example of a sample holding mechanism according to a second embodiment.

FIG. 5 illustrates one configuration example of a sample holding mechanism according to the second embodiment. The second embodiment is another embodiment of the sample holding mechanism 100 that includes the window 102 with the support film that supports the sample being disposed, the hole 104 that has the linear-shaped edge and through which the reference wave is transmitted, and the layer 106 that is thicker than the support film that is disposed on the edge of the window 102. In the configuration of the second embodiment, the thick layers 106 that surround the multiple widows 102 are not linked together continuously unlike the configuration of the first embodiment. That is, the second embodiment is the same as the first embodiment in the point that the sample holding mechanism 100 includes the thin-film rectangular window 102 with the support film that supports the sample being disposed, the rectangular hole 104 through which the reference wave is transmitted, and the layer 106 that is thicker than the support film. However, in the second embodiment, the layer 106 that is thicker than the support film that is formed on the edge of the thin-film rectangular window 102 is formed only on a peripheral part of the rectangular hole 104 through which the reference wave is transmitted. Consequently, the sample holding mechanism 100 has a configuration that an extreme-thin region occupies the majority and therefore an observable region is widened. It is desirable that the relation in Formula 1, that is, W2>2×W1 be established between the width 112 (W1) of the rectangular window 102 and the width 114 (W2) of the rectangular hole 104 in order to facilitate acquisition of the reference hologram also in the second embodiment.

Figure 6:
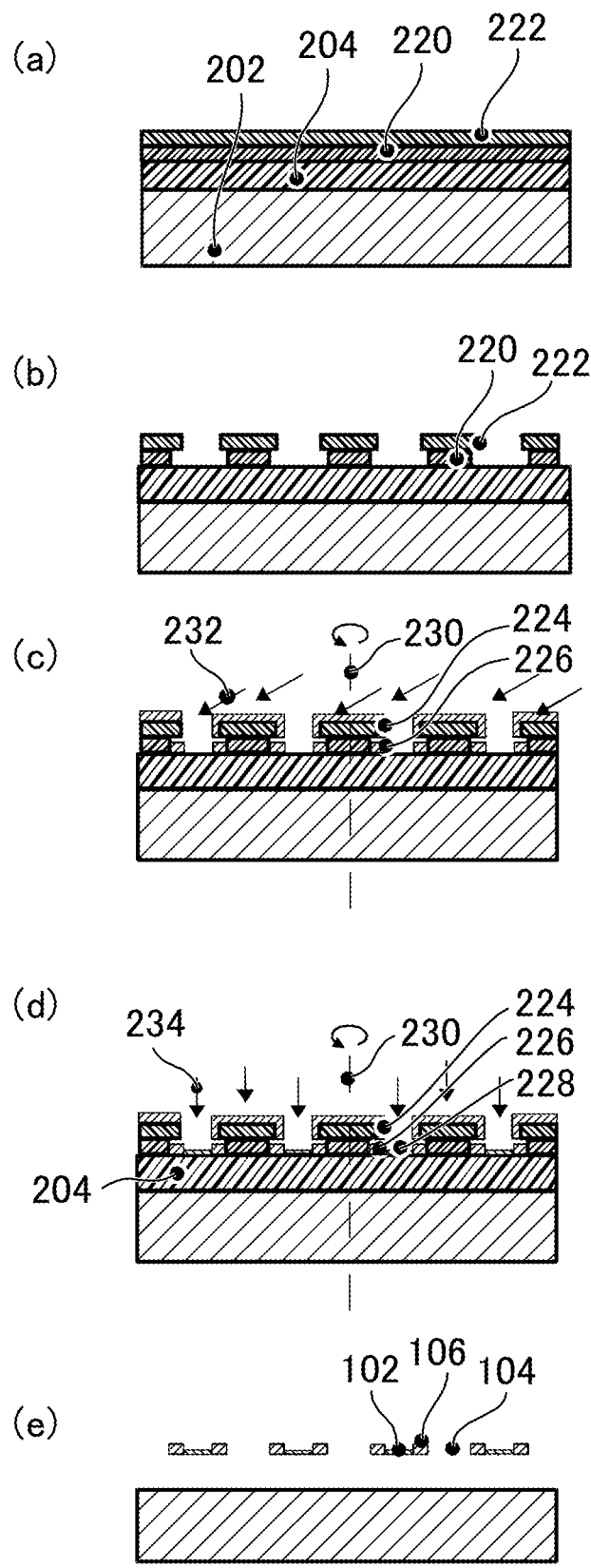
FIGS. 6(a)-(e) are diagrams illustrating one example of a procedure for manufacturing the sample holding mechanism according to the second embodiment.

FIG. 6 illustrates sectional structure diagrams of a process for realizing the configuration according to the second embodiment. In this process, the sample holding mechanism 100 is manufactured by using, for example, lithography, oblique vapor deposition and normal incident vapor deposition. That is, this process is the manufacturing method for the sample holding mechanism that is configured to form the support film that supports the sample and the layer that is thicker than the support film by making the switch between the oblique vapor deposition and the normal incident vapor deposition to a reverse-tapered two-layered resist pattern and has an advantage that it is possible to greatly reduce the number of processes for micromachining by combining production of a microstructure by lithography with the oblique vapor deposition.

First, as illustrated in (a) of FIG. 6, the sacrificing layer 204 is coated onto the substrate 202 on which the flat surface is obtained over a large area by, for example, spin coating and so forth, two kinds of resist layers, that is, a first negative-type resist layer 220 and a second negative-type resist layer 222 that are mutually different in compression ratio in heat curing treatment are formed on the sacrificing layer 204, and thereby a four-layered structure that is configured by the substrate 202, the sacrificing layer 204, the first negative-type resist layer 220, and the second negative-type resist layer 222 is formed.

Then, as illustrated in (b) of FIG. 6, rectangular drawing and development processing are performed under a condition that although the first negative-type resist layer 220 and the second negative-type resist layer 222 layer are exposed to light, the sacrificing layer 204 is not exposed to light and thereby a reverse-tapered resist pattern that is rectangular when viewed from above is formed.

Then, as illustrated in (c) of FIG. 6, a substance that will form the thin-film rectangular window 102 is obliquely vapor-deposited while rotating the substrate 202 on an axis of rotation 230. Since deposition with directional beams is desirable for effective functioning of the oblique vapor deposition, methods such as a vacuum vapor deposition method, an ion beam sputtering method, a low-gas-pressure sputtering method and so forth are suited. Thereby, a deposited substance grows on only a pattern side face of the first negative-type resist layer 220, and a pattern side face and an upper face of the second negative-type resist layer 222. In addition, a situation where a deposit 224 on the first negative type resist layer 220 and a deposit 226 on the second negative type resist layer 222 are separated from each other occurs. At this stage, growing of the substance deposited on the sacrificing layer 204 hardly occurs.

Then, as illustrated in (d) of FIG. 6, a deposition flux 234 is made to enter from a normal direction of the substrate 202 this time. Thereby, the deposited substance reaches only on the sacrificing layer 204 that is exposed to the resist pattern side and the pattern upper face of the second negative-type resist layer 222 and forms an extreme-thin support layer 228. A deposition amount is adjusted in such a manner that a thickness of the extreme-thin support layer 228 becomes thinner than a thickness of a layer that grows on the pattern side face of the first negative-type resist layer 220 in the previous stage.

Finally, as illustrated in (e) of FIG. 6, the deposit 224 is eliminated by floating off the resist patter layer and only the deposit 226 onto the second negative type resist layer 222 and the support layer 228 remain on the sacrificing layer 204. Further, the sacrificing layer 204 is removed using acids, alkalis, organic solvents and so forth and thereby it becomes possible to separate the grid configured by the thin-film rectangular window 102, the rectangular hole 104 through which the reference wave is transmitted, and the layer 106 that is thicker than the support film from the substrate 202.

Third Embodiment

The third embodiment is an embodiment of a charged particle beam device that includes an electron source, a sample holding mechanism that includes a window with a support film that supports a sample being disposed, a hole that has a linear-shaped edge and through which a reference wave is transmitted, and a layer that is thicker than the support film that is disposed on an edge of the window and in which the multiple windows and the multiple holes are arrayed, a mechanical movement mechanism that performs movement of the sample holding mechanism, an image shift deflection optical system that performs parallel shifting of an image along a linear-shaped side of the hole in the sample holding mechanism, a detector that detects an electron beam that is emitted from the electron source and is transmitted through the sample holding mechanism, and a control unit that performs visual field selection by controlling the image shift deflection optical system and the mechanical movement mechanism and controls to continuously acquire images from an array of the windows and the holes on the basis of an output from the detector.

Figure 7:
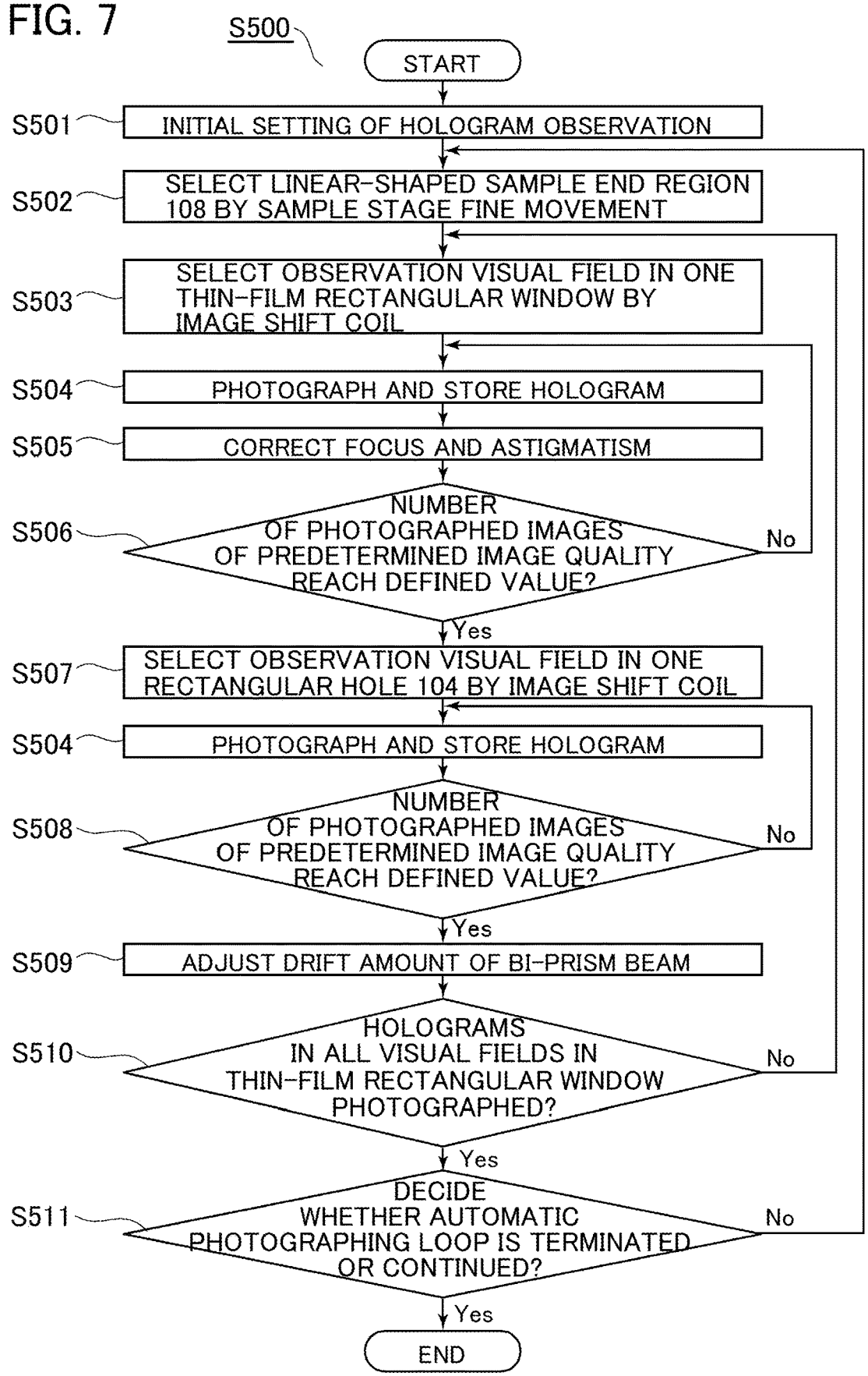
FIG. 7 is a diagram illustrating one example of a main routine of a flowchart of automatic photographing performed by an electron microscope (a charged particle beam device) according to a third embodiment.

In the third embodiment, an algorithm used to continuously and automatically acquire electron beam holographic images by using the above-described sample holding mechanism while minimizing the damage of electron beam irradiation to the sample and a system control computer that is a control unit that issues a command that is based on the algorithm to an electron microscope that is the charged particle beam device will be described. Execution subjects of the algorithm that will be described in the following are the CPU of the above-described system control computer and a user of the device. FIG. 7 illustrates one example of a main routine S500 and FIG. 8 to FIG. 12 illustrates examples of sub-routines S502 to S505, and S507 of the main routine S500. In addition, FIG. 13 illustrates schematic diagrams for explaining scrolling performed for continuous acquisition of the electron beam holographic images.

In the main routine S500, first, initial setting of holography observation is performed (S501). Step S501 is the process for constructing the optical system so as to make acquisition of the electron beam holograms possible and the details thereof are not different from those of general holography observation. Determination of initial observation visual field and observation magnification, determination of movement of the electron beam biprism wire 320 into the observation visual field and a voltage to be applied to the electron beam biprism wire 320 and so forth are performed. In addition, here, it is desirable that setting be made so as to locate the electron beam biprism wire 320 and the sample end region 108 in parallel with each other as described in the first embodiment. Further, it is also desirable that setting be made so as to locate the electron beam biprism wire 320 and the sample end region 108 in parallel with the external form of the detector 340.

Figure 8:
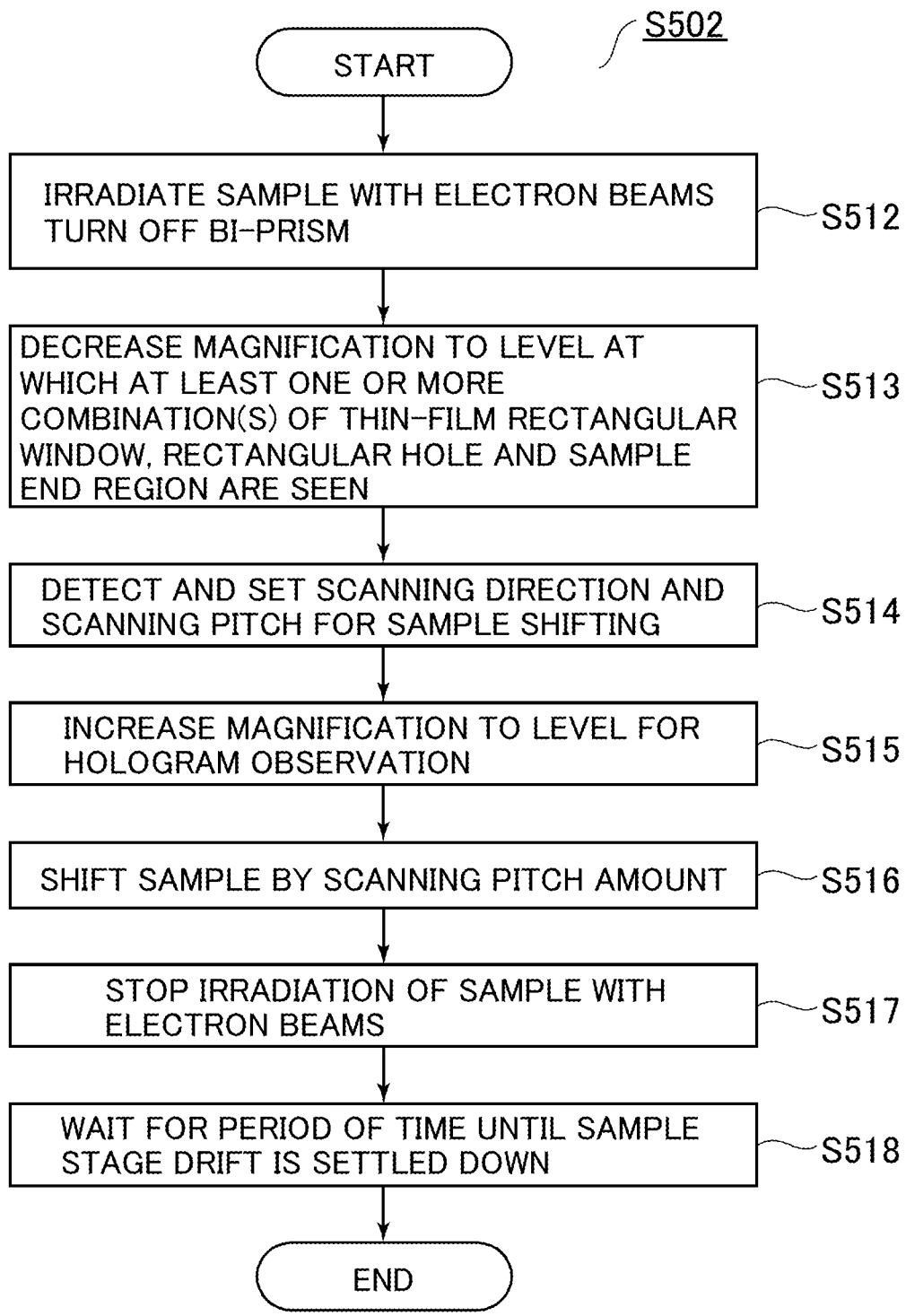
FIG. 8 is a diagram illustrating one example of a subroutine executed to select a thin-film rectangular window by fine movement of a sample stage in the charged particle beam device according to the third embodiment.
Figure 9:
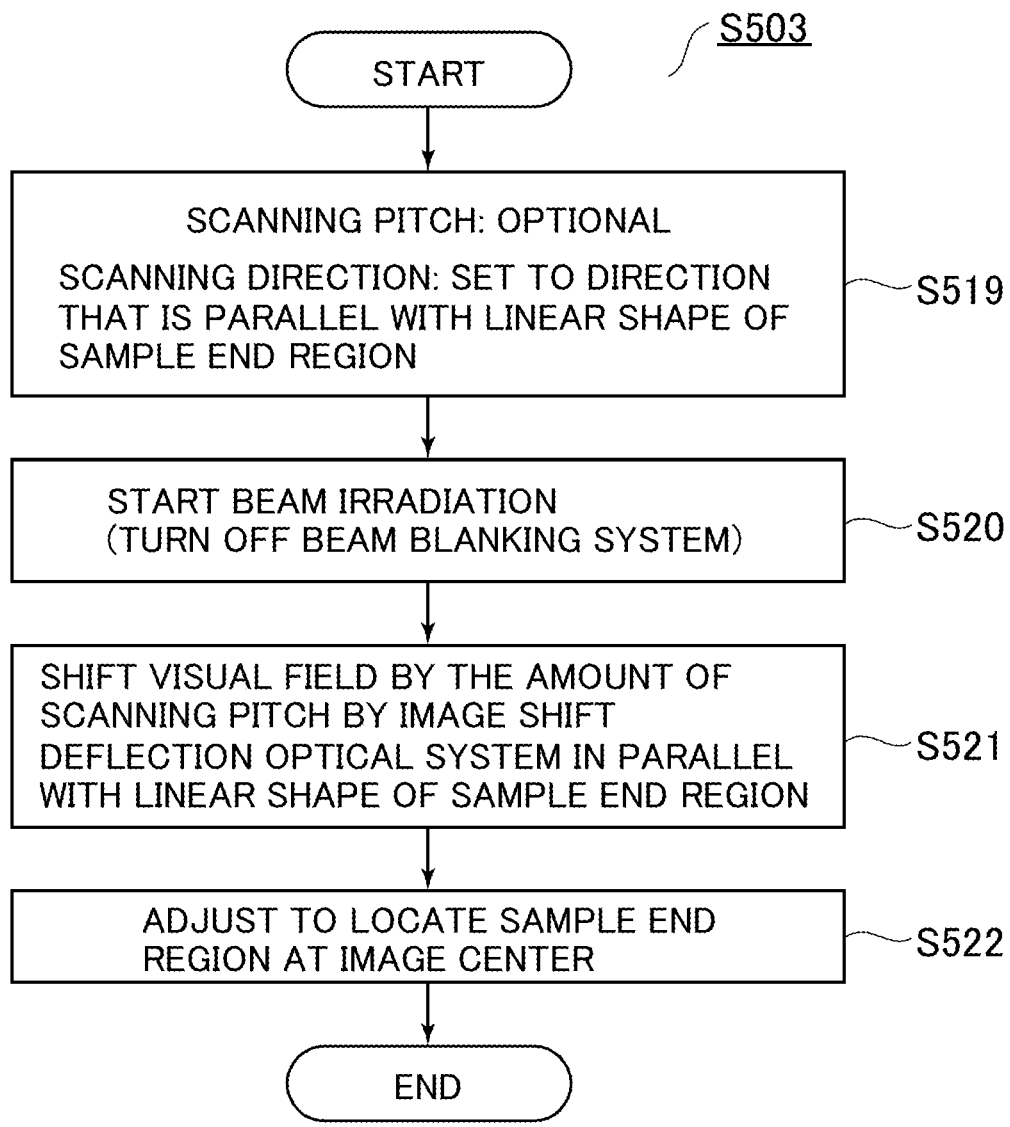
FIG. 9 is a diagram illustrating one example of a subroutine executed to select an observation visual field in one thin-film rectangular window by an image shift deflection optical system in the charged particle beam device according to the third embodiment.

Then, in the sub-routine S502 that is illustrated in detail in FIG. 8, the linear-shaped sample end region 108 is selected by fine movement of the sample stage. First, the beam blanking system 343 is turned off, or the beam blanking system 343 is turned off by opening a mechanical shutter. In this state, the sample is irradiated with the electron beams and the electron beam biprism wire 320 is withdrawn from the visual field (S512). The magnification is decreased to a magnification level at which at least one or more combination(s) of the thin-film rectangular window 102, the rectangular hole 104 through which the reference wave is transmitted, and the linear-shaped sample end region 108 that is located on the boundary line between the rectangular window 102 and the rectangular hole 104 is/are observed (S513). A direction in which the sample end region 108 is linearly shaped is detected, this direction is defined as a scanning direction for sample movement, and determination and setting of a scanning pitch are further performed (S514). Then, an image is magnified up to a magnification level at which a hologram is obtained (S515). A command is issued from the system control computer 350 to the image shift deflection optical system control unit 354 so as to move the sample by a scanning pitch amount that is determined in step S514 (S516). Here, since it is desirable to wait for a certain period of time until drift of the sample stage is calmed down, irradiation of the sample with the electron beams is stopped so as to avoid occurrence of the damage to the sample (S517) and a standby state is maintained for the certain period of time until the drift of the sample stage is calmed down (S518). In a case where a sample that is highly resistive to electron beam irradiation is to be measured, the electron beam may not be turned off. With this, execution of the sub-routine S502 is terminated.

In high-magnification holographic observation, it generally occurs that the size of the observation visual field becomes smaller than that of the thin-film rectangular window 102. In this case, it is preferable that photographing be performed by continuously shifting multiple visual fields in one thin-film rectangular window 102. Therefore, the observation visual field is selected by the image shift deflection optical system 344 that is configured by an image shift coil in one thin-film rectangular window 102 in the sub-routine S503 that is illustrated in detail in FIG. 9. First, the scanning pitch is optionally set. The scanning direction is set in parallel with the direction in which the sample end region 108 is linearly shaped similarly to the direction that is determined in step S502 (S519). The start position is finely adjusted by the image shift deflection optical system 344 in such a manner that the sample end region 108 is located at the center of the image. Then, the electron beam is turned on by turning off the beam blanking system 343 (S520) in such a manner that the observation sample 304 is irradiated with the electron beam. As illustrated in (3) of FIG. 13, scrolling 362 of the amount corresponding the scanning pitch is performed by the image shift deflection optical system 344 (S521) to further perform adjustment in such a manner that the sample end region 108 is located at the center of the image (S522). The sample holding mechanism 100 used in the charged particle beam device according to the third embodiment is excellent in the point that in a case where the sample holding mechanism 100 in which the thin-film rectangular window 102 and the rectangular hole 104 through which the reference wave is transmitted are separated from each other along the linear-shaped boundary line is used, it is possible to repetitively perform the scrolling 362 by the image shift coil in parallel with the sample end region 108 linearly with no consideration of the external form of the sample holding mechanism 100. Alternatively, the scrolling 362 may be mechanically performed by the sample movement mechanism similarly to that in step S502.

Figure 10:
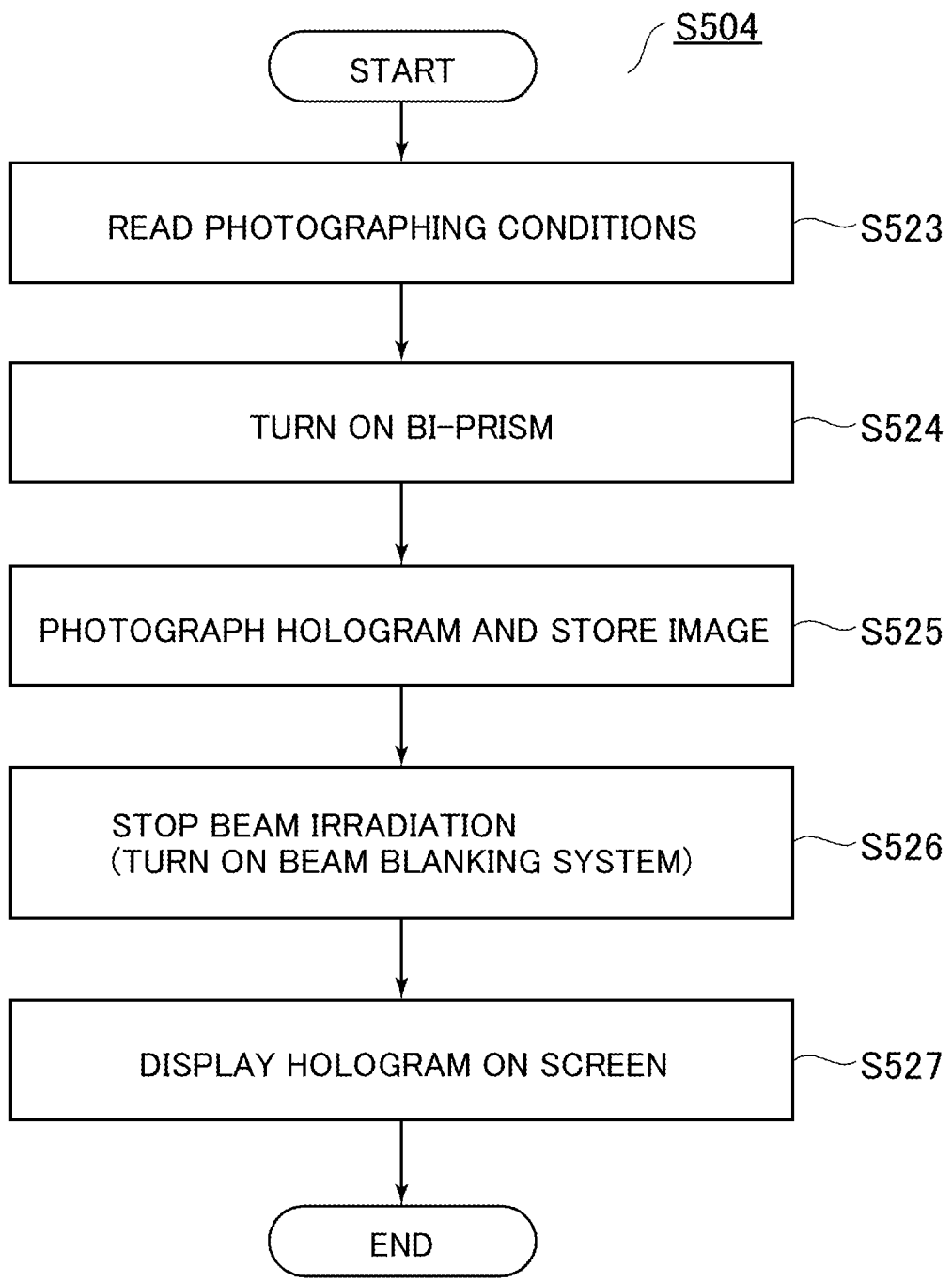
FIG. 10 is a diagram illustrating one example of a sub-routine executed to perform hologram photographing and storage in the charged particle beam device according to the third embodiment.
Figure 11:
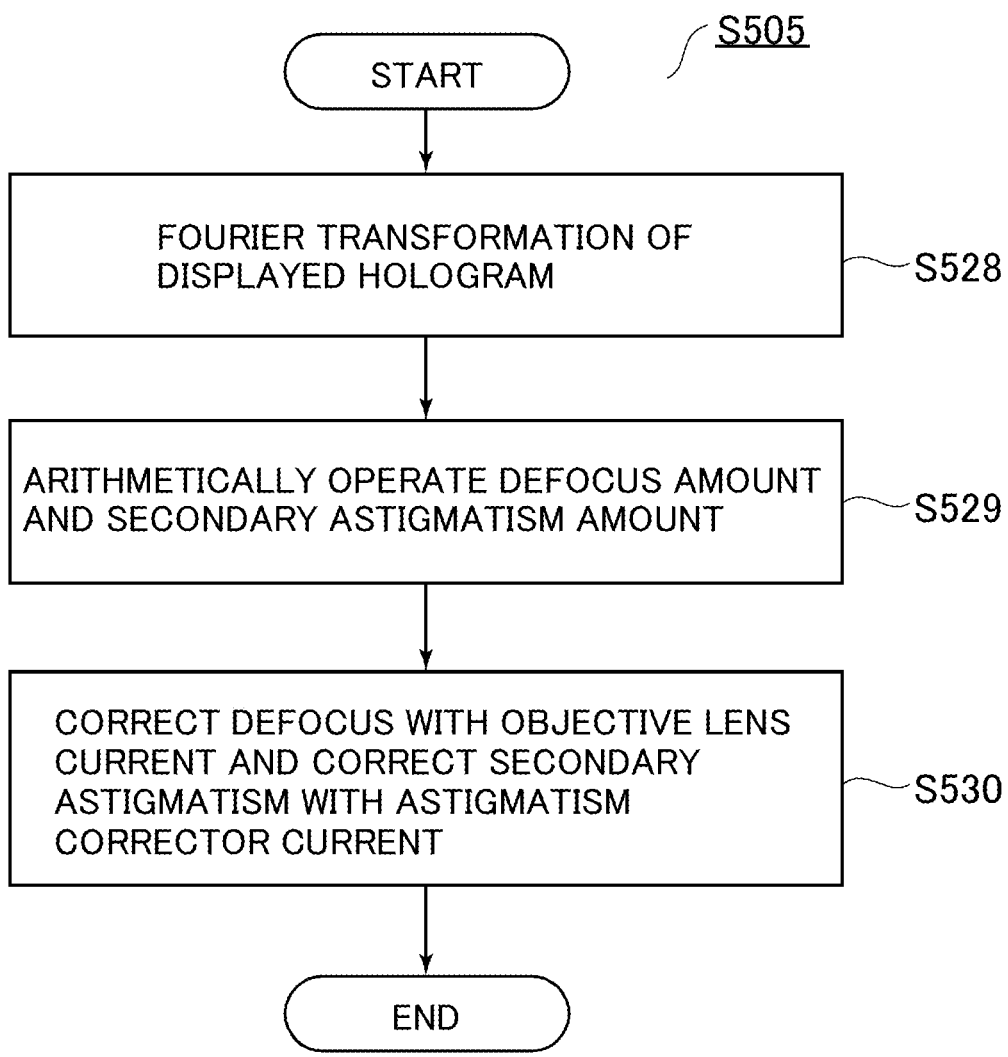
FIG. 11 is a diagram illustrating one example of a sub-routine executed to perform measurement and adjustment for focus correction and astigmatism correction in the charged particle beam device according to the third embodiment.

At termination of positional alignment of the observation visual field, acquisition of the hologram is performed in the sub-routine S504 illustrated in FIG. 10. Here, it is desirable to acquire the holograms that are photographed under an optical condition that satisfies predetermined conditions per visual field by a cumulative number of sheets with which a sufficient signal-noise ratio is obtained. For this purpose, loop processing (S506) is performed by combining processes in the sub-routine S504 with focus correction and astigmatism correction that are executed in the sub-routine S505 in FIG. 11.

In the sub-routine S504, first, photographing conditions such as the number of holograms to be photographed at one time, an exposure time and so forth are set (S523), thereafter a voltage is applied to the electron beam biprism 308 by the electron beam biprism control unit 355 (S524), and thereby the object wave and the reference wave are subjected to Coulomb deflection to generate the inclined object wave wave-front 330 and the reference wave wave-front 332 and then to generate the interference fringes 342 on the detector surface 340. Here, one hologram is photographed and an image thereof is stored (S525). Then, irradiation of the sample with the electron beams is suspended by turning on the beam blanking system 343 (S526). Then, the hologram is displayed on the display (S527). The order in which the beam blanking system 343 is turned on and the hologram is displayed on the display may be reversed.

Electro-optical photographing conditions that are set immediately after termination of positional alignment may not be optimized. Therefore, then, focus correction and astigmatism correction are performed in the sub-routine S505 (S505). Fourier transform is performed on the displayed hologram (S528) and a defocus (out-of-focus) amount and an amount of secondary astigmatism are obtained by using arithmetic operations (S529). A current value of the objective lens 306 is rewritten in accordance with the defocus amount and a current value of an astigmatism corrector is rewritten in accordance with the secondary astigmatism amount (S530) in order to correct an obtained deviation amount to a predetermined value (S530). Alternatively, this focus optimization may be performed on the basis of a transmission electron microscopic image. After execution of the sub-routine S505, another hologram is acquired by returning again back to the sub-routine S504. In a case where it is found that further correction is desirable as a result of measurement of the corrected focus and the corrected astigmatism, correction is repetitively performed and the loop processing of the sub-routines S504 and S505 is repetitively executed (S506) until the predetermined number of photographed holograms of a predetermined image quality is obtained.

After termination of execution of the loop processing of the sub-routines S504 and S505 in one visual field, then, acquisition of reference holograms is performed. Reference hologram acquisition is an operation of deducting the phase effect of the electron beam that the electron beam biprism wire 320 itself produces in highly accurate phase measurement. Visual field selection for this purpose is performed in the sub-routine S507 in FIG. 12.

Figure 12:
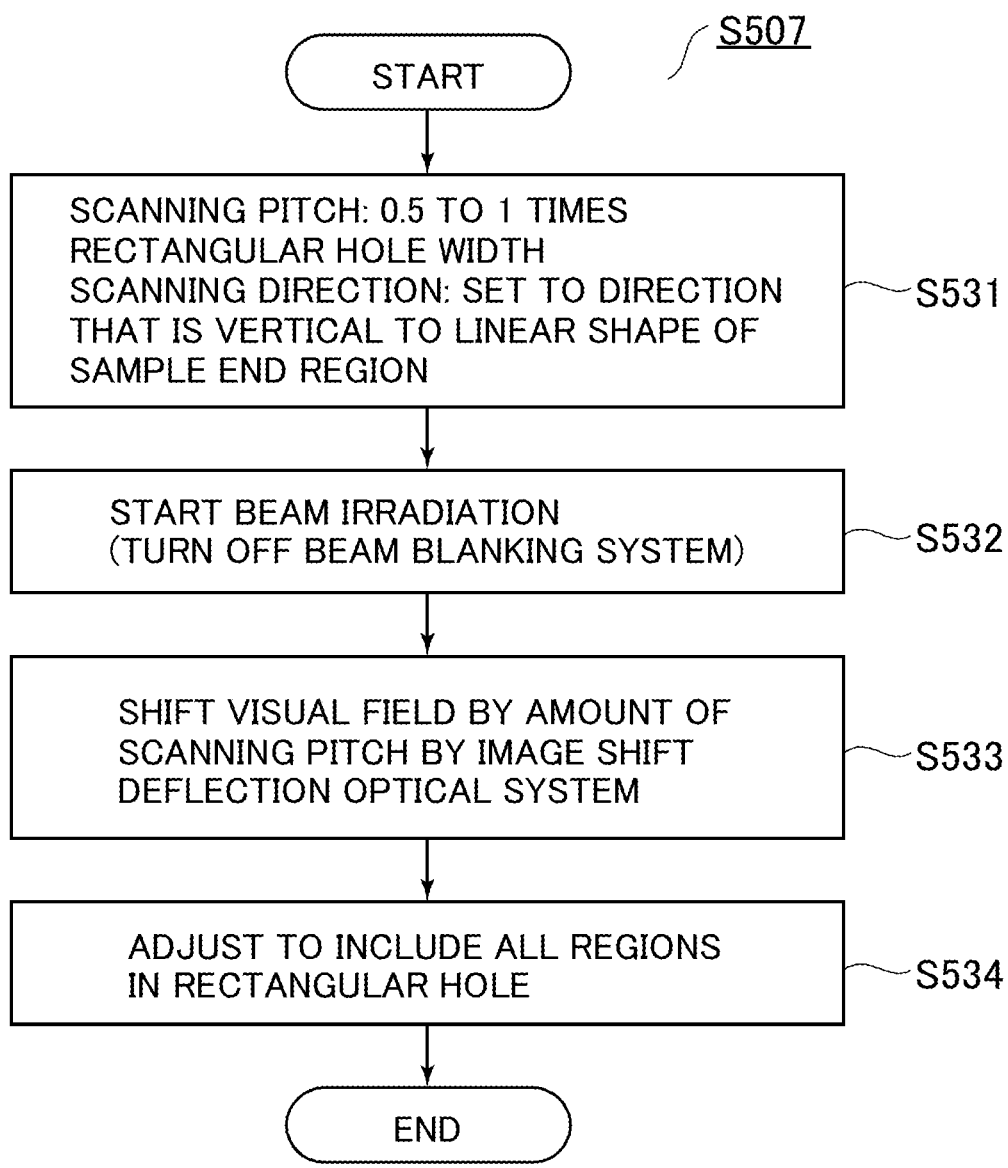
FIG. 12 is a diagram illustrating one example of a sub-routine executed to select the observation visual field in one rectangular hole by the image shift deflection optical system in the charged particle beam device according to the third embodiment.
Figure 13:
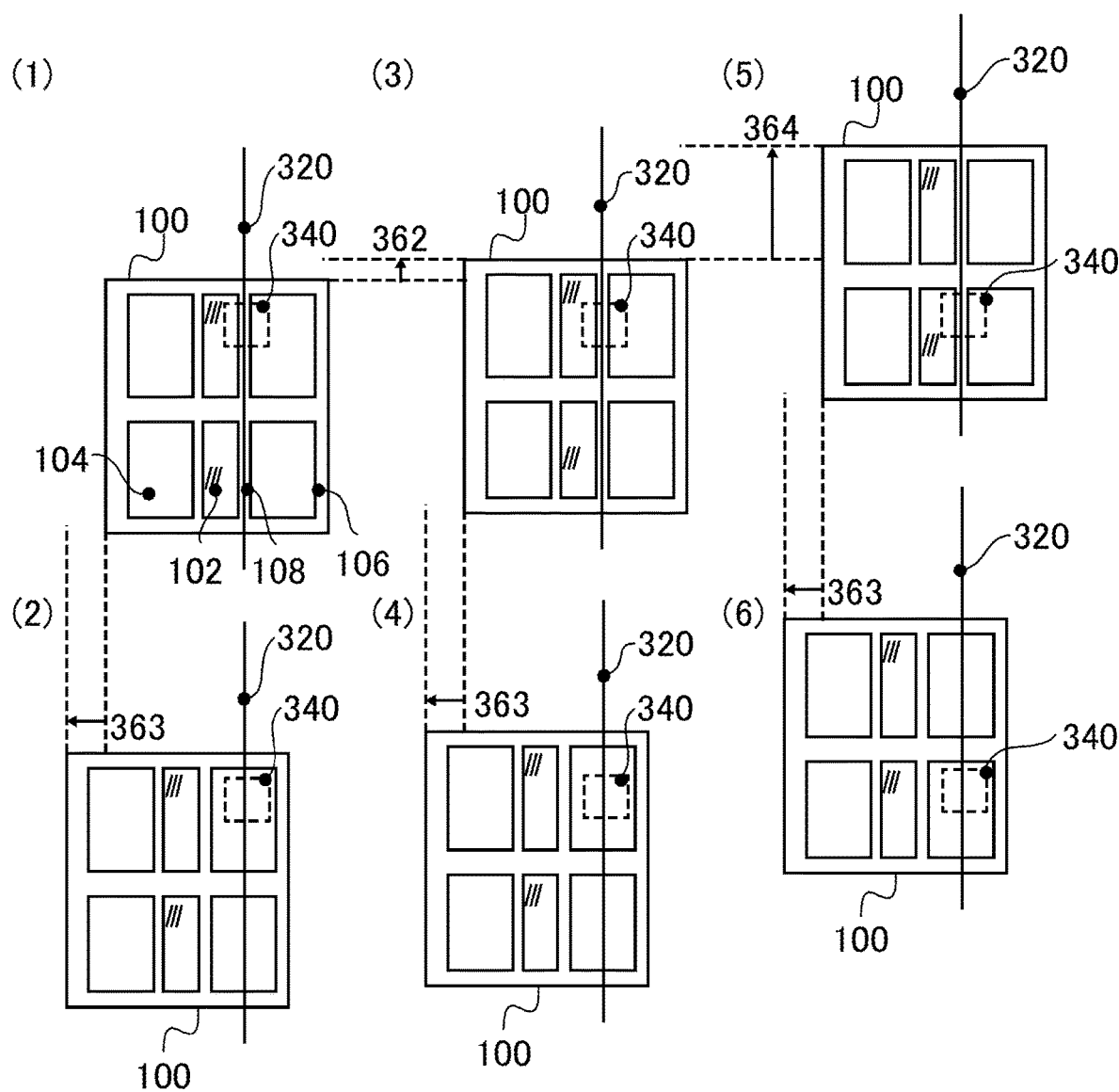
FIG. 13 is diagrams illustrating one example of visual field shifting (scrolling) performed to continuously acquire electron beam holographic images in the charged particle beam device according to the third embodiment.

In FIG. 12, a direction in which scrolling is performed is set toward the inside of the rectangular hole 104 in a direction that is vertical to the sample end region 108 (S531), an optional value that is within a range from a value that is 0.5 times the width of the rectangular hole 104 to a value that is equal to the width of the rectangular hole 104 is set as the scanning pitch and scrolling 363 is performed by the image shift deflection optical system 344 in a direction that is vertical to the sample end region 108 for acquisition of the reference holograms as illustrated in (2) of FIG. 13 and electron beam irradiation is started (S532). That is, the electron beam is turned on by turning off the beam blanking system 343. Then, scrolling of the amount corresponding to the scanning pitch is performed by the image shift deflection optical system 344 (S533) and further adjustment is performed in such a manner that all regions are included in the rectangular hole 104 (S534).

Owing to execution of the above-described routines, only the rectangular hole through which the reference wave is transmitted is set as an observation region, the wave-front of the electron wave that passes through the rectangular hole 104 is divided into two wave-fronts by the electron beam biprism wire 320, and thereby it becomes possible to form the electron beam interference fringes 342 between the electron waves that propagate in the vacuum on the detector surface 340. Incidentally, it goes without saying that it is preferable that the width of the rectangular hole 104 be sufficiently wide and be at least two times the width of the rectangular window 102 in order to perform reference hologram acquisition while one thin-film rectangular window 102 is being observed. The sub-routine S504 may be used again for acquisition of an image of the reference hologram. The sub-routine S504 is repetitively executed until a predetermined number of the reference holograms of the predetermined image quality is obtained (S508). Incidentally, acquisition of the reference holograms may be separately performed after termination of scanning of all the samples.

After acquisition of the predetermined number of the holograms of the predetermined image quality that each include the observation sample 304 and the predetermined number of the reference holograms of the predetermined image quality that each do not include any of the observation sample 304, the thin-film rectangular window 104, and the sample end region 108 by performing the above-described operations, correction of a drift amount of the beam that passes through the electron beam biprism 308 and a drift amount of the electron biprism is performed (S509), further the scrolling 362 by the image shift coil (the image shift deflection optical system 344) is performed in parallel with the sample end region 108 and thereby acquisition of holograms in another visual filed is performed as illustrated in (3) of FIG. 13. Further, as illustrated in (4) of FIG. 13, the scrolling 363 by the image shift coil (the image shift deflection optical system 344) is performed vertically to the sample end region 108 and the reference holograms are acquired.

After completion of measurement of the multiple visual fields in the target thin-film rectangular window 102 by repetitive performance of the above-described measurement (S510), another thin-film rectangular window 102 is selected by scrolling 364 performed by fine movement of the sample stage (S502) as illustrated in (5) of FIG. 13, the multiple observation visual fields in another thin-film rectangular window 102 are selected by the scrolling 362 performed by the image shift deflection optical system 344 (S503) and the acquisition of the sample holograms (S504), the focus correction and astigmatism correction (S505), and the acquisition of the reference holograms (S507 and S504) illustrated in (6) of FIG. 13 are executed by loop-processing so as to acquire the predetermined number of the holograms of the predetermined image quality. After completion of the measurement of the sample in the predetermined number of the thin-film rectangular windows 102 and measurement of the predetermined number of the rectangular holes 104 by performing the above-described processes (S511), execution of the main routine S500 is terminated.

According to the third embodiment, automatic acquisition of data on several thousand holograms is possible by using the sample holding mechanism 100 in which the thin support film parts that support the sample (the windows 102) and the vacuum region parts (the holes 104) are arrayed in a state where each window 102 and each hole 104 are separated from each other along the linear-shaped boundary part that is thicker than the support film and by controlling the sample holding mechanism 100 using the system control computer 350 so as to continuously acquire the sample holograms and the reference holograms from the array of the windows 102 and the holes 104.

Incidentally, the present invention is not limited to the above-described embodiments and various modified examples are included in the present invention. For example, the above embodiments are described in detail for better understanding of the present invention and are not necessarily limited to the ones that include all the configurations that are described above. In addition, it is possible to replace part of one configuration of one embodiment with one configuration of another embodiment and it is also possible to add one configuration of another embodiment to one configuration of one embodiment. In addition, addition/deletion/replacement of another configuration to/from/with part of one configuration of each embodiment are possible.

Further, although an example in which a program used to realize some or all of the respective configurations, functions and so forth of the above-described processing units is prepared is described, it goes without saying that some or all of the configurations, the functions and so forth of the above-described processing units may be implemented in hardware by designing some or all of them by, for example, an integrated circuit and so forth. That is, some or all of the functions of the processing units may be implemented by the integrated circuit and so forth such as, for example, an ASIC (Application, Specific Integrated Circuit), an FPGA (Field Programmable Gate Array) and so forth in place of the program.

What is claimed is:
1. A sample holding mechanism comprising:
   a window with a support film that supports a sample being disposed;
   a hole that has a linear-shaped edge and through which a reference wave is transmitted; and a layer that is thicker than the support film that is disposed on an edge of the window.

2. The sample holding mechanism according to claim 1, wherein a plurality of the windows and a plurality of the holes are included, and respective regions of the layer that is thicker than the support film that is disposed on the edge of each of the plurality of windows are continuously linked together as one layer.

3. The sample holding mechanism according to claim 1, wherein the hole is a rectangular hole, the window is a rectangular window, and a plurality of the rectangular holes and a plurality of the rectangular windows are periodically arrayed.

4. The sample holding mechanism according to claim 3, wherein a width of the rectangular hole is at least two times a width of the rectangular window.

5. The sample holding mechanism according to claim 3, wherein a width of a region of the thick layer that separates the rectangular hole and the rectangular window from each other is not more than about 500 nanometers.

6. The sample holding mechanism according to claim 1, wherein a substance that configures the window includes amorphous carbon, graphite, graphene, boron nitride, beryllium oxide, silicon oxide, and silicon nitride that each contain a light element as a principal component and a thickness of the substance is not more than about 50 nanometers.

7. A charged particle beam device comprising:
an electron source;
a sample holding mechanism that includes a window with a support film that supports a sample being disposed, a hole that has a linear-shaped edge and through which a reference wave is transmitted, and a layer that is thicker than the support film that is disposed on an edge of the window and in which a plurality of the windows and a plurality of the holes are arrayed;
a mechanical movement mechanism that performs movement of the sample holding mechanism;
an image shift deflection optical system that performs parallel shifting of an image along a linear-shaped side of the hole in the sample holding mechanism;
a detector that detects an electron beam that is emitted from the electron source and is transmitted through the sample holding mechanism; and
a control unit that performs visual field selection by controlling the image shift deflection optical system and the mechanical movement mechanism and controls to continuously acquire images from an array of the windows and the holes on the basis of an output from the detector.

8. The charged particle beam device according to claim 7, further comprising a beam blanking system that turns on/off the electron beam.

9. The charged particle beam device according to claim 7, further comprising an electron beam biprism that includes an electron beam biprism wire that is disposed in parallel with the linear-shaped edge of the hole,
wherein the control unit controls to continuously acquire a plurality of sample holograms and a plurality of reference holograms from the array of the windows and the holes.

10. The charged particle beam device according to claim 9,
wherein the control unit controls to dispose the linear-shaped edge of the hole and the electron beam biprism wire in parallel with each other by rotating the sample holding mechanism or the electron beam biprism.

11. The charged particle beam device according to claim 9,
wherein the control unit controls to select an observation visual field in the window and to acquire the sample holograms.

12. The charged particle beam device according to claim 9,
wherein the control unit controls to select an observation visual field in the hole and to acquire the reference holograms.

* * * * *